(12) United States Patent
Upputuri et al.

(10) Patent No.: US 12,241,931 B1
(45) Date of Patent: Mar. 4, 2025

(54) METHOD AND APPARATUS FOR CAPTURE CLOCK CONTROL TO MINIMIZE TOGGLING DURING TESTING

(71) Applicant: Marvell Asia Pte Ltd, Singapore (SG)

(72) Inventors: Balaji Upputuri, Prakasam (IN); Scott Mack, Rochester, MN (US)

(73) Assignee: Marvell Asia Pte Ltd, Singapore (SG)

( * ) Notice: Subject to any disclaimer, the term of this patent is extended or adjusted under 35 U.S.C. 154(b) by 268 days.

(21) Appl. No.: 18/153,269

(22) Filed: Jan. 11, 2023

Related U.S. Application Data

(60) Provisional application No. 63/299,001, filed on Jan. 12, 2022.

(51) Int. Cl.
| | | |
|---|---|---|
| *G06F 11/10* | (2006.01) |
| *G01R 31/317* | (2006.01) |
| *G06F 11/07* | (2006.01) |
| *G06F 11/30* | (2006.01) |
| *G06F 13/16* | (2006.01) |
| *G06F 13/28* | (2006.01) |

(52) U.S. Cl.
CPC . *G01R 31/31727* (2013.01); *G01R 31/31703* (2013.01); *G01R 31/31725* (2013.01)

(58) Field of Classification Search
CPC ........ G01R 31/31725; G01R 31/31703; G01R 31/31727
See application file for complete search history.

(56) References Cited

U.S. PATENT DOCUMENTS

| | | | |
|---|---|---|---|
| 6,175,882 B1 * | 1/2001 | Bunton ............... | G06F 13/4291 327/39 |
| 6,232,845 B1 * | 5/2001 | Kingsley .......... | G11C 29/50012 365/201 |
| 9,286,423 B2 * | 3/2016 | Asaad .............. | G01R 31/31727 |
| 9,322,876 B2 | 4/2016 | Bheemanna et al. | |
| 12,009,043 B2 * | 6/2024 | Kim .................... | G11C 29/4401 |
| 2003/0229835 A1 * | 12/2003 | Whetsel ......... | G01R 31/318572 714/727 |
| 2006/0248487 A1 * | 11/2006 | Kapoor ................. | G06F 30/327 716/135 |
| 2011/0050247 A1 * | 3/2011 | Marshall .......... | G01R 31/31725 324/617 |
| 2013/0174104 A1 * | 7/2013 | Vishweshwara ........ | G06F 30/39 716/54 |
| 2017/0017258 A1 * | 1/2017 | Park .......................... | G06F 1/04 |
| 2017/0235864 A1 * | 8/2017 | Wilson .................. | G06F 30/327 716/108 |
| 2023/0114367 A1 * | 4/2023 | Rasouli ................ | H03K 3/0372 327/202 |

\* cited by examiner

*Primary Examiner* — Guy J Lamarre

(57) ABSTRACT

A method of testing an integrated circuit device includes detecting a number of integrated clock gates (ICGs) in the device. Each ICG can stop clock propagation in a respective branch of a clock tree of the device. For each detected ICG, an ICG fanout (a number of digital inputs that the output of each ICG can feed) is compared with a threshold number of registers. When the ICG fanout is greater than the threshold number, it is determined whether a function-enable path of an existing ICG is timing-critical. When the function-enable path of the existing ICG is timing-critical, an additional ICG and a test point are inserted into the device as a clock input to the existing ICG. When the function-enable path of the existing ICG is not timing-critical, a test point and an AND-gate may be inserted in that function-enable path.

20 Claims, 6 Drawing Sheets

METHOD AND APPARATUS FOR CAPTURE CLOCK CONTROL TO MINIMIZE TOGGLING DURING TESTING

CROSS REFERENCE TO RELATED APPLICATION

This disclosure claims the benefit of commonly-assigned U.S. Provisional Patent Application No. 63/299,001, filed Jan. 12, 2022, which is hereby incorporated by reference herein in its entirety.

FIELD OF USE

This disclosure relates to scan-chain testing of an integrated circuit design. More particularly, this disclosure relates to preventing excessive toggling of an integrated circuit design during scan-chain/logic testing.

BACKGROUND

The background description provided herein is for the purpose of generally presenting the context of the disclosure. Work of the inventors hereof, to the extent the work is described in this background section, as well as aspects of the description that may not otherwise qualify as prior art at the time of filing, are neither expressly nor impliedly admitted to be prior art against the subject matter of the present disclosure.

Integrated circuit devices may be tested by scan-chain testing, in which a predetermined pattern of 0s and 1s is clocked through the registers of a specific logic path in the integrated circuit device. Testing may be performed in software—e.g., as a simulation—to validate the design of integrated circuit device—from both functional and timing perspectives—prior to fabrication. During this simulation, the testing process may cause portions of the integrated circuit design to toggle at a higher rate than designed for, potentially giving rise to false failures.

SUMMARY

In accordance with implementations of the subject matter of this disclosure, a method of testing an integrated circuit device includes detecting a number of integrated clock gates in the integrated circuit device, each integrated clock gate being disposed in a respective branch of a clock tree of the integrated circuit device to stop clock propagation in the respective branch of the clock tree, for each detected integrated clock gate, comparing an integrated clock gate fanout with a threshold number of registers, the integrated clock gate fanout being a number of digital inputs that the output of each integrated clock gate can feed, determining, when the integrated clock gate fanout is greater than the threshold number of registers, whether a function-enable path of an existing integrated clock gate is timing-critical, and when it is determined that the function-enable path of the existing integrated clock gate is timing-critical, inserting, into the integrated circuit device, an additional integrated clock gate and a test point, as a clock input to the existing integrated clock gate.

A first implementation of such a method may further include, when it is determined that the function-enable path of the existing integrated clock gate is not timing-critical, inserting a test point and an AND-gate in the function-enable path of the existing integrated clock gate.

A first aspect of that first implementation may include controlling clock tree activity of the integrated circuit device using the integrated clock gate with the test point and AND-gate.

A second implementation of such a method may further include checking whether the integrated clock gate fanout exceeds a maximum number of registers such that the integrated clock gate needs to be cloned.

A first aspect of that second implementation may further include cloning the integrated clock gate when the checking determines that the integrated clock gate fanout exceeds the maximum number of registers.

According to a second aspect of that second implementation, determining whether the function enable path of the existing integrated clock gate is timing-critical is based on whether the checking determines that the integrated clock gate fanout exceeds the maximum number of registers.

A third implementation of such a method may further include calculating a worst-case power usage of the integrated circuit device, comparing the calculated worst-case power usage with an estimated power usage based on a design of the integrated circuit device, and continuing or ending the testing based on the comparing.

According to a first aspect of that third implementation, calculating the worst-case power usage may include calculating worst-case power usage at both a minimum voltage and a maximum voltage.

In a fourth implementation of such a method, the inserting may limit a toggle rate of a respective clock tree branch controlled by the existing integrated clock gate.

According to a first aspect of that fourth implementation, the inserting may limit the toggle rate to remain within a design activity factor of the integrated circuit device.

According to implementations of the subject matter of this disclosure, testing apparatus for testing an integrated circuit device includes a detection unit configured to detect a number of integrated clock gates in the integrated circuit device, each integrated clock gate being disposed in a respective branch of a clock tree of the integrated circuit device to stop clock propagation in the respective branch of the clock tree, a comparator unit configured to compare, for each detected integrated clock gate, an integrated clock gate fanout with a threshold number of registers, the integrated clock gate fanout being a number of digital inputs that the output of each integrated clock gate can feed, a test signal unit configured to determine, when the integrated clock gate fanout is greater than the threshold number of registers, whether a function-enable path of an existing integrated clock gate is timing-critical, and a simulation unit configured to, when it is determined that the function-enable path of the existing integrated clock gate is timing-critical, insert into the integrated circuit device, an additional integrated clock gate and a test point, as a clock input to the existing integrated clock gate.

In a first implementation of such a testing apparatus, the simulation unit may further be configured to, when it is determined that the function-enable path of the existing integrated clock gate is not timing-critical, insert a test point and an AND-gate in the existing integrated clock gate enable path.

According to a first aspect of that first implementation, the test signal unit may further be configured to control clock tree activity of the integrated circuit device using the integrated clock gate with the test point and AND-gate.

In a second implementation of such testing apparatus, the test calculation unit may further be configured to check whether the integrated clock gate fanout exceeds a maximum number of registers such that the integrated clock gate needs to be cloned.

A first aspect of that second implementation may further include a cloning unit configured to clone the integrated clock gate when the integrated clock gate fanout exceeds the maximum number of registers.

According to a second aspect of that second implementation, the test signal unit may further be configured to determine whether the function-enable path of an existing integrated clock gate is timing-critical, when the integrated clock gate fanout does not exceed the maximum number of registers.

A third implementation of such testing apparatus may further include a power usage calculation unit configured to calculate a worst-case power usage of the integrated circuit device, compare the calculated power with an estimated power usage based on a design of the integrated circuit device, and continue or end the testing based on the comparing.

According to a first aspect of that third implementation, the power usage calculation unit may further be configured to calculate worst-case power usage at both a minimum voltage and a maximum voltage.

In a fourth implementation of such testing apparatus, the simulation unit may be configured to limit a toggle rate of a respective clock tree branch controlled by the existing integrated clock gate.

According to a first aspect of that fourth implementation, the test signal unit may be configured to limit the toggle rate to remain within a design activity factor of the integrated circuit device.

BRIEF DESCRIPTION OF THE DRAWINGS

Further features of the disclosure, its nature and various advantages, will be apparent upon consideration of the following detailed description, taken in conjunction with the accompanying drawings, in which like reference characters refer to like parts throughout, and in which.

DETAILED DESCRIPTION

Figure 1:
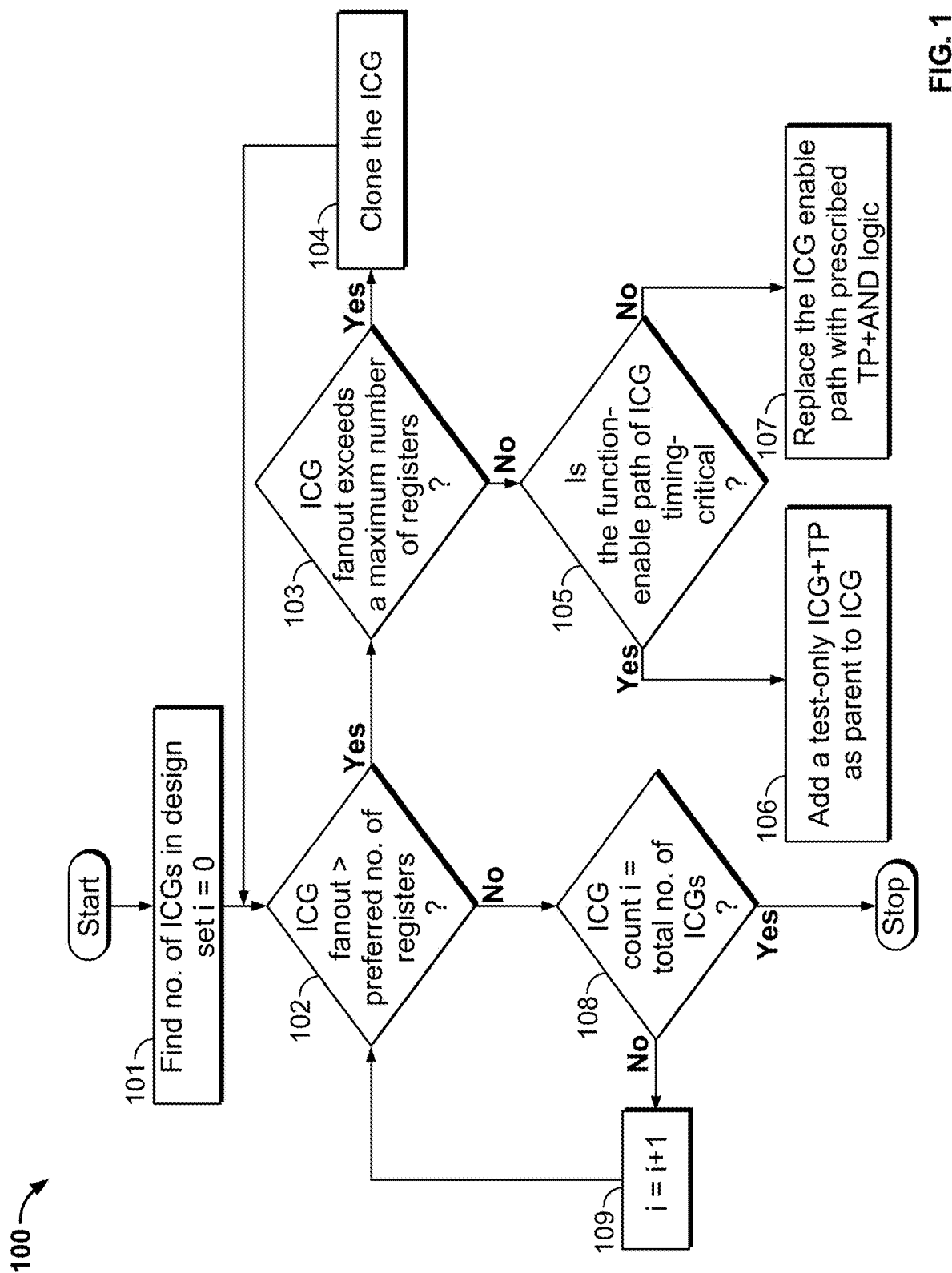
FIG. 1 is a flow diagram illustrating implementations of a method in accordance with the subject matter of this disclosure.

As noted above, in an integrated circuit, toggle rate is a measure of the average number of times a signal changes value, thereby representing how much of a design is transitioning in any given capture clock cycle, the clock cycle representing the amount of time between like edges of two pulses of a signal. Toggles are induced by the changing state of the design, as register capturing new values which propagate through downstream logic.

Automatic test pattern generation (ATPG) testing is a process by which a machine generates a scan chain pattern for testing, with a sequence that will reveal particular errors, rather than having to create the test pattern sequence manually. ATPG helps determine an input sequence which, when applied to a digital circuit, propagates in an expected way—either unchanged or changed in a known way. A fault in the digital circuit design may be indicated if the input sequence emerges from testing with unexpected changes. However, in some cases, ATPG testing may cause a toggle rate in the integrated circuit that exceeds the functional toggle rate that may be expected during actual operation of the integrated circuit. If that excessive toggle rate exceeds the design specifications of the integrated circuit device, the testing may indicate a design failure, even though the failure conditions can never occur during actual operation. For example, too high of a toggle rate may cause a power droop—i.e., a voltage drop at locations in the integrated circuit—that would otherwise not occur during normal operation.

While parameters of the ATPG testing may be adjusted to limit the toggle rate of the integrated circuit design, using such adjustments to prevent false failures is dependent on intervention by the person carrying out the testing. For example, manual partitioning of clock domains is currently utilized to limit the toggle rate during testing of integrated circuit designs. However, such manual action of partitioning clock domains may be insufficient to guarantee that the design activity factor (which defines the limits within which the toggle rate should remain) will not be exceeded during the simulation of the scan chain pattern.

One way to control toggling of logic is to prevent registers from being clocked. A new value is captured every time a register is clocked. Preventing a register from being clocked would prevent the value stored in the register from changing, which in turn would prevent a value change from propagating downstream through the logic and causing additional toggling.

Therefore, in accordance with implementations of the subject matter of this disclosure, an integrated control gate may be added to an integrated circuit design ATPG testing. The integrated control gate determines when to allow clock tree segments to be active, thereby keeping the integrated circuit design within the design activity factor specification during testing by turning off a clock tree segments if keeping the segment active would result in excessive toggling.

The integrated control gate may be added to the actual integrated circuit device, and the actual device may be tested. During testing, the integrated control gate may be used to turn off clock segments as discussed above, and then not used during actual runtime operation of the integrated circuit device. However, ATPG pattern development and testing is frequently carried out as a simulation rather than using real devices, because a parallel testbench simulation can read the states of all registers simultaneously, which for a real device would be possible only if a probe point is provided for each register. With respect to the subject matter of this disclosure, observing the effect of adding and altering integrated control gates can more easily be performed in a simulation, as compared to the lengthy process of preparing a completely new design with added gates, and proceeding through the fabrication process to observe the results of adding those gates.

The subject matter of this disclosure may be better understood by reference to FIGS. 1-6.

FIG. 1 is a flow diagram illustrating implementations of a method in accordance with the subject matter of this disclosure. Although it may theoretically be possible to test an actual fabricated device according to the methods described herein, such actual parallel testing, to test the values of a plurality of registers of the integrated circuit device, would require providing probe points in the device for each register in the scan chain to be read in parallel. Furthermore, providing the necessary probe points for such parallel testing, even if desired, may be difficult to achieve. Therefore, as described above, testing may be performed in software—e.g., as a simulation—to validate the design of integrated circuit device—from both functional and timing perspectives—prior to fabrication.

The testing process 100 begins at 101, by determining the number of integrated clock gate (ICG) cells in the integrated circuit design, to make sure all the ICGs are cycled through during the simulation testing, as described below in further detail. Each ICG may be used for clock gating, to prevent clock propagation through an ICG when a low clock enable signal is applied to the ICG.

Once the number of ICGs is determined, the fanout of the first ICG is compared at 102 with a threshold number of registers, where the threshold number of registers is based on particular characteristics of the integrated circuit design, and may vary for different integrated circuit designs. If it is determined at 102 that the ICG fanout is greater than the threshold number of registers, the testing process 100 moves to 103 to limit the toggle rate as described below. Alternatively, if it is determined at 102 that the ICG fanout is less than or equal to the threshold number of registers, then at 108, the process 100 checks to see if the respective fanouts of all ICGs have been compared to the threshold numbers of registers. If it is determined that all the ICGs have not been compared with the threshold number of registers, then at 109, the process increments to the next ICG and returns to 102 to compare the fanout of the next ICG with the threshold number of registers.

As mentioned above, if it is determined at 102 that the ICG fanout is greater than the threshold number of registers, then at 103, it is determined whether the ICG fanout exceeds a maximum number of registers, rendering the fanout too large for one ICG, thereby necessitating a need to clone the ICG—i.e., to add an additional ICG. The particular maximum number of registers that would make the fanout too large is based on particular characteristics of the integrated circuit design being tested and may differ for different integrated circuit designs. The process is handled differently, as described below, for situations where the fanout exceeds the maximum number of registers, as compared to situations where the fanout is between the threshold number of registers and the maximum number of registers.

Following a determination at 103 that the ICG fanout exceeds the maximum number of registers, the testing process 100 moves to 104 to clone the ICG. However, if it determined that the ICG fanout does not exceed the maximum number of registers, the testing process 100 checks at 105 whether the function enable path of the ICG is timing-critical. Testing process 100 provides two different solutions to limit the toggle rate based on the determination made at 105 regarding whether or not the function enable path of the ICG is timing-critical.

If the function enable path of the ICG is determined to be timing-critical, then at 106, testing process 100 alters the clock input by adding a test-only ICG and a test point to the clock input of the ICG in order to limit the toggle rate. Further details regarding adding a test-only ICG and a test point as a clock input to the ICG are provided with reference to FIG. 2 below.

However, if, at 105, it is determined that the function enable path of the ICG is not timing-critical, then at 107, testing process 100 alters the function-enable input of the ICG, inserting a test point and an AND-gate in the enable path of the ICG. By altering the enable path of the ICG, testing process 100 effectively adds a control gate to the integrated circuit design which can control when clock tree segments are active, thereby controlling the clock tree activity of the integrated circuit design and keeping the integrated circuit design within the design activity factor specification during testing. Further details regarding inserting the test point and AND-gate in the enable path of the ICG are provided with reference to FIG. 3 below.

Figure 2:
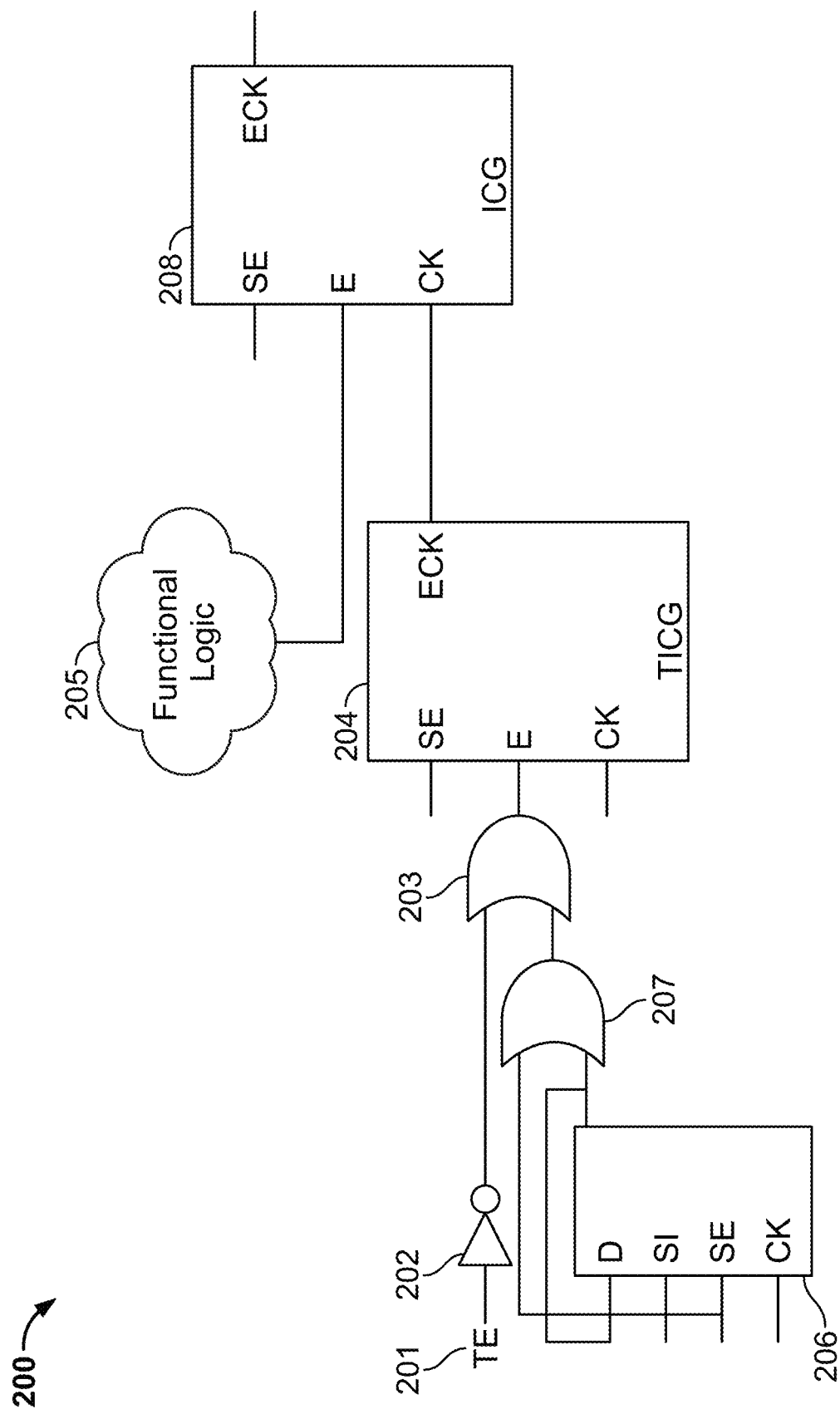
FIG. 2 is a schematic diagram of a first implementation of an integrated clock gate in accordance with the subject matter of this disclosure.

When it is determined that the function-enable path of the ICG is timing-critical, the testing process 100 is able to limit the toggle rate by adding a test-only ICG 204 and a test point as a clock signal input to the ICG 208. FIG. 2 depicts an implementation of an ICG 208 undergoing testing process 100, which may be a simulation as noted above, with a test-only ICG 204 and a test point added as a clock signal input to ICG 208, as discussed above with reference to FIG. 1 at 106. As shown in FIG. 2, function logic 205 forms the function-enable input to ICG 208. Testing process 100 introduces the output clock signal of a test-only ICG 204 as the clock input of the ICG 208. Test-only ICG 204 further incorporates, as its function-enable input, a test point signal based on a processed test-enable signal 201.

To achieve the function-enable input at the test-only ICG 204, a test-enable signal 201 is passed through an inverter (NOT-gate) 202. The output of the inverter 202 is then processed through an OR-gate 203 along with the output from another OR-gate 207 which processes the circuit 206.

The output from OR-gate 203 serves as the test point which is used as a function-enable input for test-only ICG 204. As described above, the output clock signal from test-only ICG 204 forms the clock input for ICG 208, thereby allowing test-only ICG 204 to control the clocking of registers by ICG 208. By preventing registers from being clocked, test-only ICG 204 may prevent a possible value change, which in turn prevents the downstream toggles caused by a value change in the register.

Figure 3:
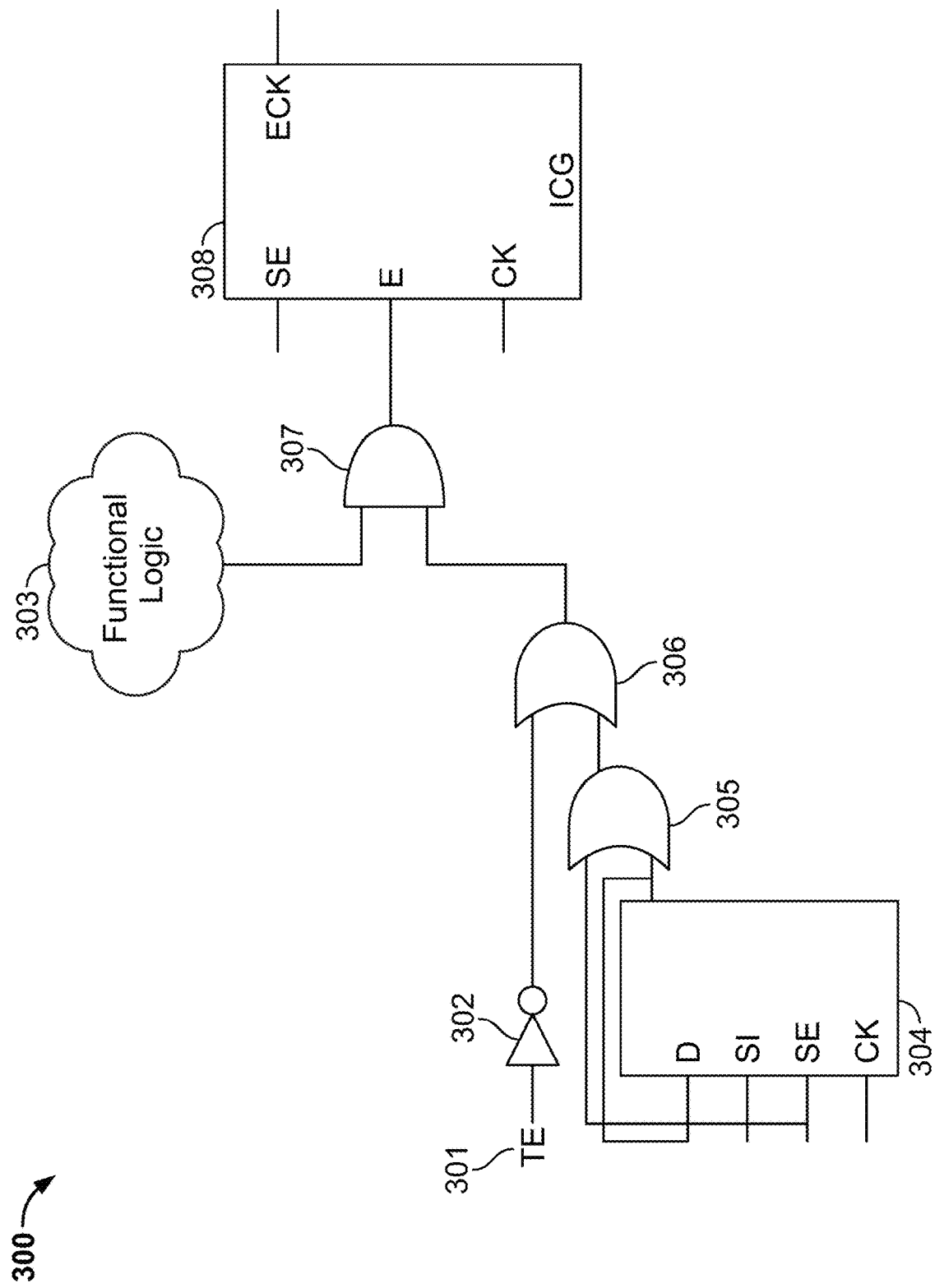
FIG. 3 is a schematic diagram of a second implementation of an integrated clock gate in accordance with the subject matter of this disclosure.

When it is determined that the function-enable path of the ICG is not timing-critical, testing process 100 is able to limit the toggle rate by inserting a test point and an AND-gate on the ICG function-enable path input. As shown in FIG. 3, instead of adding a test-only ICG 204 at the clock input of ICG 308, testing process 100 inserts, on the function-enable input to ICG 308, a processed test-enable signal 301 and the function logic 303, both of which are processed through an AND-gate 307.

To achieve this function-enable input at the ICG 308, the test enable signal 301 is passed through an inverter (NOT-gate) 302. The output of the inverter 302 is then processed through an OR-gate 306 along with the output from another OR-gate 305 which processes the circuit 304.

The output from the OR-gate 306 is then processed through an AND-gate 307 along with the function logic 303 to form the function-enable input of ICG 308, to limit the toggle rate to within a preferred range.

A primary reason for being concerned with excessive toggling is that excessive toggling may cause a device to exceed its design power consumption. Therefore, in some implementations of the subject matter of this disclosure, the testing process may simulate the worst-case power consumption and compare the simulated worst-case power consumption to the designed benchmark, or "estimated," power consumption, and only if the simulated worst-case power consumption exceeds the design power consumption would clock gating as described above be invoked. Otherwise, if the simulated worst-case power consumption is at or below the design power consumption then there is no reason to be concerned with the toggle rate and the clock gating would not be necessary, as follows.

Figure 4:
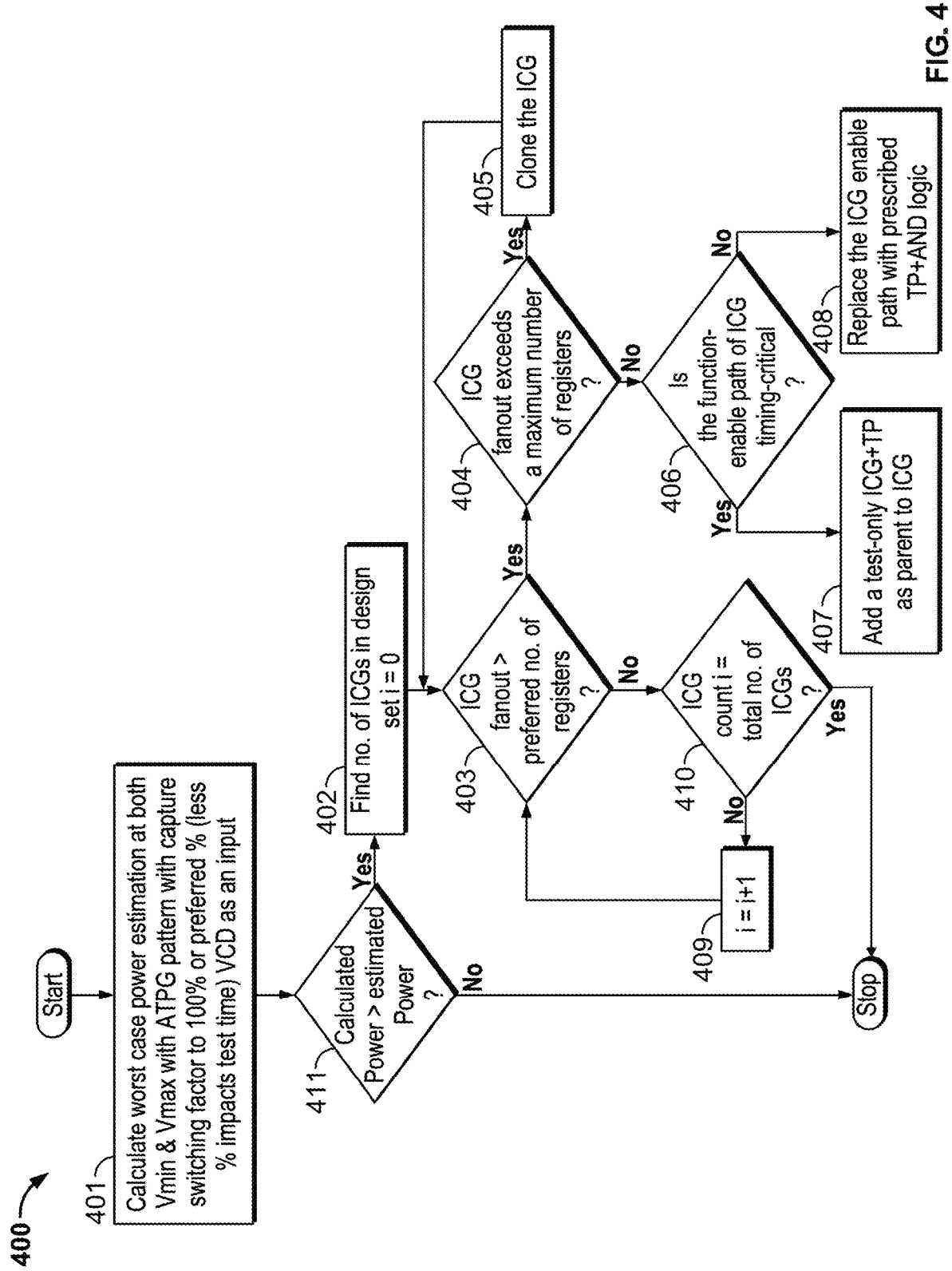
FIG. 4 is a flow diagram illustrating implementations of a method in accordance with the subject matter of this disclosure.

FIG. 4 is a flow diagram illustrating implementations of a method 400 of testing the integrated circuit design including monitoring the power consumption of the design, in accordance with the subject matter of this disclosure. The testing process 400 depicted in FIG. 4 incorporates, in a testing process such as that described above with reference to FIG. 1, a worst-case power estimation at both the maximum and minimum voltages of the ATPG testing. The process 400 begins at 401 where the worst-case power consumption is calculated, via simulation, at both the maximum and minimum voltages of the ATPG testing. Following the power calculation, the testing process 400 checks at 411 to see if the calculated power is greater than the estimated benchmark power. If it is determined at 411 that the calculated power is less than the estimated power, then clock gating is not needed to control toggling to reduce power consumption, and therefore the testing simulation ends.

However, if it is determined at 411 that the calculated power is greater than the estimated power, the testing process 400 continues by counting at 402 the number of ICGs in the integrated circuit design, and that number is eventually used as a limit to make sure all of the ICGs are processed during the simulation testing, as described below in further detail.

Once the number of ICGs is determined, the fanout of the first ICG is compared with the threshold number of registers at 403, similar to the simulated testing process 100 depicted in FIG. 1. If it is determined at 403 that the ICG fanout is greater than the threshold number of registers, the testing process 400 moves to 404 to limit the toggle rate. Alternatively, if it is determined at 403 that the ICG fanout is less than or equal to the threshold number of registers, the testing process moves to 410 to determine if the respective fanouts of all ICGs have been compared to the threshold numbers of registers. If it is determined at 410 that fanouts of all of the ICGs have not been compared with the threshold number of registers 400, then at 409, the process increments to the next ICG and returns to comparing the fanout value of the next ICG with the threshold number of registers at 403.

If, however, it is determined at 403 that the ICG fanout is greater than the threshold number of registers, then at 404, it is determined whether the ICG fanout exceeds the maximum number of registers, so as to require cloning the ICG. As described above with reference to FIG. 1, a particular maximum number of registers that would make the fanout too large to be handled by one ICG is based on particular characteristics of the integrated circuit design being tested and may differ for different integrated circuit designs. Following this determination 404, if the ICG fanout is determined to exceed the maximum number of registers, the testing process 400 moves to 405 to clone the ICG. However, if it determined that the ICG fanout does not exceed the maximum number of registers, the testing process 400 checks at 406 whether the function-enable path of the ICG is timing-critical.

The testing process 400 provides two different solutions to limit the toggle rate based on the determination made at 406 regarding whether or not the function-enable path of the ICG is timing-critical.

If the function enable path of the ICG is determined to be timing-critical, then at 407, the testing process 400 alters the clock input by adding a test-only ICG and a test point as a parent to the ICG to limit the toggle rate at 407. Further details regarding adding a test-only ICG and a test point as a parent were provided with reference to FIG. 2 above.

However, if, at 406, it is determined that the function enable path of the ICG is not timing-critical, then at 408, the testing process 400 alters the function-enable input of the ICG by inserting a test point and an AND-gate in the enable path of the ICG. By altering the enable path of the ICG, the testing process 400 effectively adds a control gate to the integrated circuit design which can control when clock tree segments are active, thereby controlling the clock tree activity of the integrated circuit design and keeping the integrated circuit design within the design activity factor specification during testing. Further details regarding inserting the test point and AND-gate in the enable path of the ICG were provided with reference to FIG. 3 above.

Figure 5:
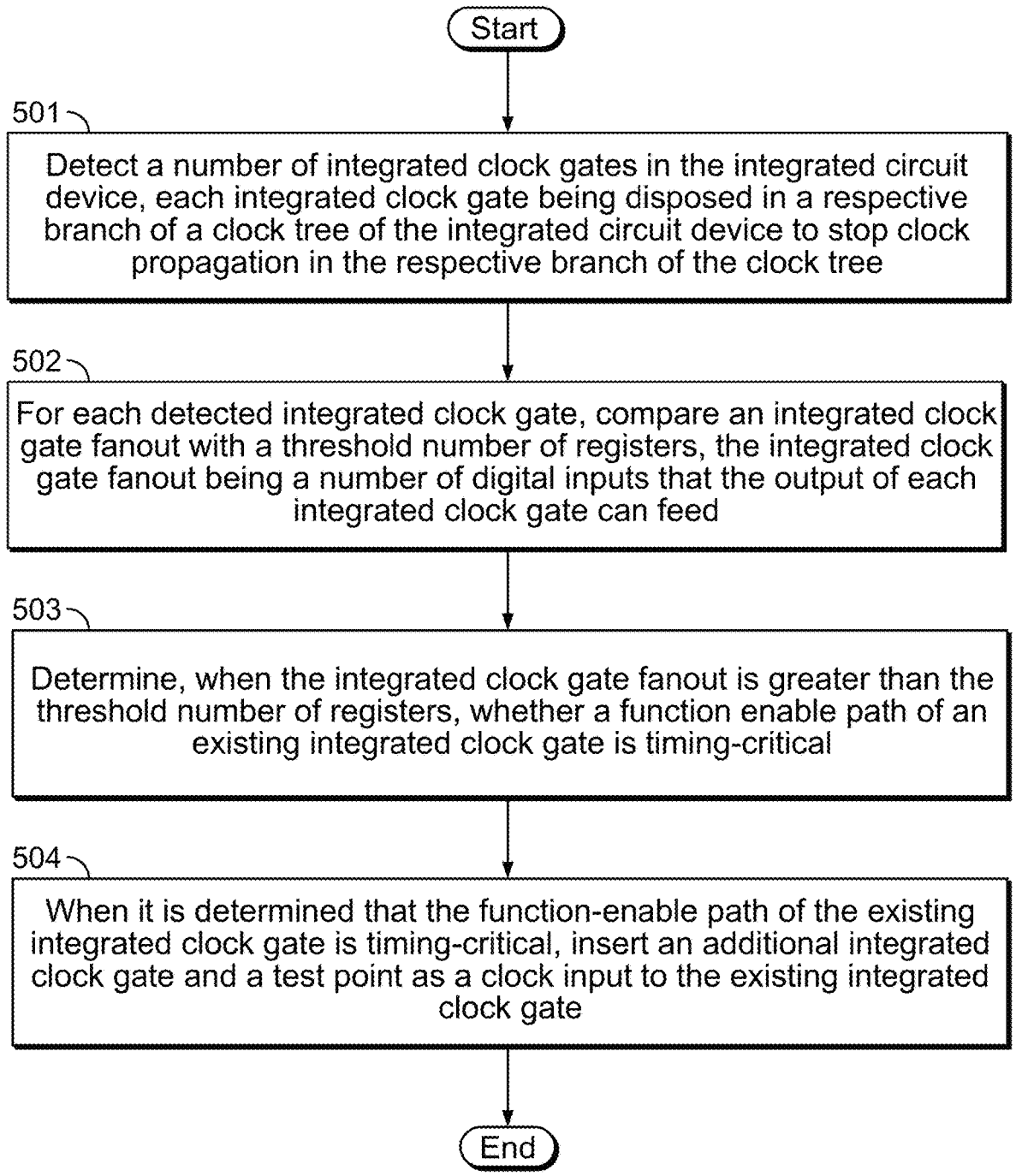
FIG. 5 is a flow diagram illustrating implementations of a method in accordance with the subject matter of this disclosure.

FIG. 5 is a flow diagram illustrating implementations of a method in accordance with the subject matter of this disclosure. Method 500 begins at 501 where a number of integrated clock gates in the integrated circuit device, each integrated clock gate being disposed in a respective branch of a clock tree of the integrated circuit device to stop clock propagation in the respective branch of the clock tree, is detected. Next, at 502, for each detected integrated clock gate, an integrated clock gate fanout is compared with a threshold number of registers, the integrated clock gate fanout being a number of digital inputs that the output of each integrated clock gate can feed. At 503, it is determined, when the integrated clock gate fanout is greater than the threshold number of registers, whether a function enable path of an existing integrated clock gate is timing-critical. At 504, when it is determined that the function-enable path of the existing integrated clock gate is timing-critical, an additional integrated clock gate and a test point may be inserted as a clock input to the existing integrated clock gate.

Testing methods according to implementations of the subject matter of this disclosure may be carried out using testing apparatus that may be hardwired to perform the testing methods described above. The testing apparatus may also be based on a suitable processor that may be programmed via software or firmware to perform the testing processes described above.

Figure 6:
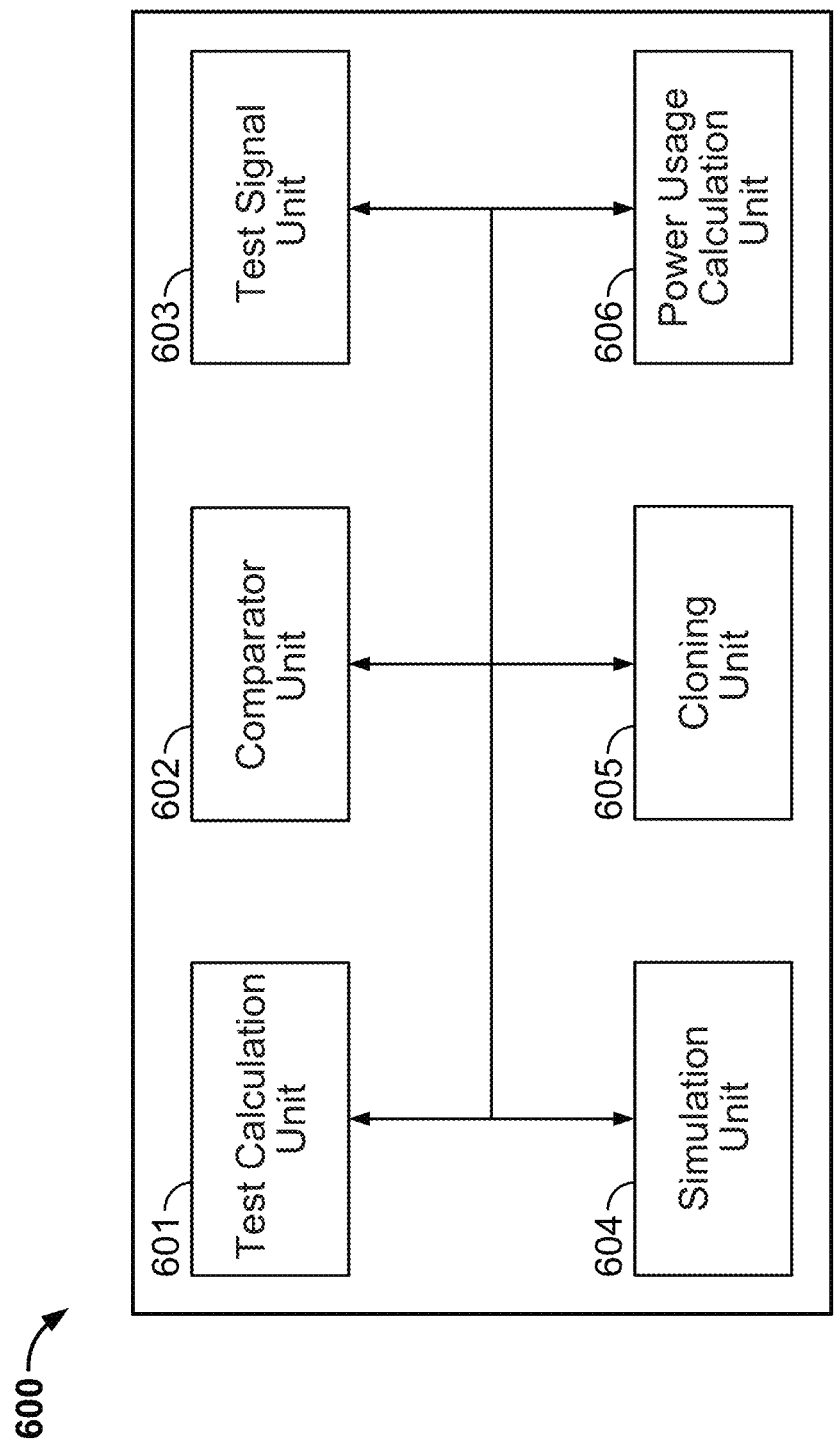
FIG. 6 is a block diagram illustrating implementations of an apparatus in accordance with the subject matter of this disclosure.

As shown in FIG. 6, the testing apparatus 600 may incorporate a plurality of circuit elements to carry out the testing methods as described above. Although six different circuit elements are shown in the embodiment of FIG. 6, elements that perform the functions of more than one of the various elements shown in FIG. 6 may be provided, or functions of one of the circuit elements may be implemented using two or more circuit elements, so that the number of circuit elements in the testing apparatus may be smaller or larger than shown in FIG. 6 while still being within the scope of the present disclosure.

Testing apparatus 600 may include a test calculation unit 601, a comparator unit 602, test signal unit 603, simulation unit 604, cloning unit 605 and power usage calculation unit 606.

Test detection unit 601 may be configured to detect a number of integrated clock gates in the integrated circuit device. As described above with reference to 101 in FIG. 1, clock propagation through an ICG cell is prevented when a low clock enable signal is applied to the ICG, which may be referred to as clock gating. The test detection unit 601 determines the number of ICGs in the integrated circuit design, which is eventually used to make sure all the ICGs are processed during the simulation testing.

The comparator unit 602 may be configured to compare an integrated clock gate fanout with a threshold number of registers, as described in testing process 100 at 102 with reference to FIG. 1 above.

The test signal unit 603 may be configured to determine, if the integrated clock gate fanout is greater than the threshold number of registers, whether a function enable path of an existing integrated clock gate is timing-critical. As described above at 105 with reference to FIG. 1, the test signal unit 603 may check whether the function enable path of the ICG is timing-critical. The simulation unit 604 alters either the clock input, or the function-enable input of the ICG, depending on whether the function-enable path is determined to be timing-critical.

The simulation unit 604 may be configured to insert an additional integrated clock gate and a test point to the integrated circuit device as a clock input to the existing integrated clock gate, or to replace the enable path of the ICG with a test point and an AND-gate, based on the determinations made by the test signal unit 603, as described above.

The cloning unit 605 may be configured to clone the integrated clock gate if the ICG fanout is too large so as to require a cloning of the ICG. The cloning unit 605 makes a determination if the ICG fanout exceeds the maximum number of registers, thereby necessitating cloning of the ICG. Following that determination, if the ICG fanout is determined to exceed the maximum number of registers, the cloning unit 605 proceeds to clone the ICG, as described above.

The power usage calculation unit 606 may be configured to calculate a worst-case power usage of the integrated circuit device. The power usage calculation unit 606 checks to see if the calculated power is greater than the estimated power, as described above.

Any one or more of the units described above may be hardwired to perform the specific functions as listed above. Alternatively, any one or more of the units may represent a processor carrying out different portions of the software/firmware testing processes as described.

Testing of integrated circuit devices in accordance with implementations of the subject matter of this disclosure, including controlling clock tree segments to limit register toggling during testing, can prevent a valid design, which would never exceed a design activity factor in actual use, from exceeding the design activity factor during testing. Therefore, the testing methods and apparatus described in this disclosure prevent false test failures, thereby improving the yield of integrated circuit fabrication processes.

As used herein and in the claims which follow, the construction "one of A and B" shall mean "A or B."

It is noted that the foregoing is only illustrative of the principles of the invention, and that the invention can be practiced by other than the described embodiments, which are presented for purposes of illustration and not of limitation, and the present invention is limited only by the claims which follow.

What is claimed is:

1. A method of testing an integrated circuit device, the method comprising:
    detecting a number of integrated clock gates in the integrated circuit device, each integrated clock gate being disposed in a respective branch of a clock tree of the integrated circuit device to stop clock propagation in the respective branch of the clock tree;
    for each detected integrated clock gate, comparing an integrated clock gate fanout with a threshold number of registers, the integrated clock gate fanout being a number of digital inputs that the output of each integrated clock gate can feed;
    determining, when the integrated clock gate fanout is greater than the threshold number of registers, whether a function-enable path of an existing integrated clock gate is timing-critical; and
    when it is determined that the function-enable path of the existing integrated clock gate is timing-critical, inserting, into the integrated circuit device, an additional integrated clock gate and a test point, as a clock input to the existing integrated clock gate.

2. The method of testing the integrated circuit device according to claim 1, further comprising:
    when it is determined that the function-enable path of the existing integrated clock gate is not timing-critical, inserting a test point and an AND-gate in the function-enable path of the existing integrated clock gate.

3. The method of testing the integrated circuit device according to claim 2 comprising controlling clock tree activity of the integrated circuit device using the integrated clock gate with the test point and AND-gate.

4. The method of testing the integrated circuit device according to claim 1, further comprising:
    checking whether the integrated clock gate fanout exceeds a maximum number of registers such that the integrated clock gate needs to be cloned.

5. The method of testing the integrated circuit device according to claim 4, further comprising:
    cloning the integrated clock gate when checking determines that the integrated clock gate fanout exceeds the maximum number of registers.

6. The method of testing the integrated circuit device according to claim 4 wherein determining whether the function enable path of the existing integrated clock gate is timing-critical is based on whether the checking determines that the integrated clock gate fanout exceeds the maximum number of registers.

7. The method of testing the integrated circuit device according to claim 1, further comprising:
    calculating a worst-case power usage of the integrated circuit device;
    comparing the calculated worst-case power usage with an estimated power usage based on a design of the integrated circuit device; and
    continuing or ending the testing based on the comparing.

8. The method of testing the integrated circuit device according to claim 7 wherein calculating the worst-case power usage comprises calculating worst-case power usage at both a minimum voltage and a maximum voltage.

9. The method of testing the integrated circuit device according to claim 1 wherein the inserting limits a toggle rate of a respective clock tree branch controlled by the existing integrated clock gate.

10. The method of testing the integrated circuit device according to claim 9 wherein the inserting limits the toggle rate to remain within a design activity factor of the integrated circuit device.

11. Testing apparatus for testing an integrated circuit device, the testing apparatus comprising:

a detection unit configured to detect a number of integrated clock gates in the integrated circuit device, each integrated clock gate being disposed in a respective branch of a clock tree of the integrated circuit device to stop clock propagation in the respective branch of the clock tree;

a comparator unit configured to compare, for each detected integrated clock gate, an integrated clock gate fanout with a threshold number of registers, the integrated clock gate fanout being a number of digital inputs that the output of each integrated clock gate can feed;

a test signal unit configured to determine, when the integrated clock gate fanout is greater than the threshold number of registers, whether a function-enable path of an existing integrated clock gate is timing-critical; and a simulation unit configured to, when it is determined that the function-enable path of the existing integrated clock gate is timing-critical, insert into the integrated circuit device, an additional integrated clock gate and a test point, as a clock input to the existing integrated clock gate.

12. The testing apparatus of claim 11, wherein the simulation unit is further configured to, when it is determined that the function-enable path of the existing integrated clock gate is not timing-critical, insert a test point and an AND-gate in the existing integrated clock gate enable path.

13. The testing apparatus of claim 12 wherein the test signal unit is further configured to control clock tree activity of the integrated circuit device using the integrated clock gate with the test point and AND-gate.

14. The testing apparatus of claim 11 wherein the test calculation unit is further configured to check whether the integrated clock gate fanout exceeds a maximum number of registers such that the integrated clock gate needs to be cloned.

15. The testing apparatus of claim 14, further comprising a cloning unit configured to clone the integrated clock gate when the integrated clock gate fanout exceeds the maximum number of registers.

16. The testing apparatus of claim 14 wherein the test signal unit is further configured to determine whether the function-enable path of an existing integrated clock gate is timing-critical, when the integrated clock gate fanout does not exceed the maximum number of registers.

17. The testing apparatus of claim 11 further comprising a power usage calculation unit configured to:
calculate a worst-case power usage of the integrated circuit device;
compare the calculated power with an estimated power usage based on a design of the integrated circuit device; and
continue or end the testing based on the comparing.

18. The testing apparatus of claim 17 wherein the power usage calculation unit is further configured to calculate worst-case power usage at both a minimum voltage and a maximum voltage.

19. The testing apparatus of claim 11 wherein the simulation unit is configured to limit a toggle rate of a respective clock tree branch controlled by the existing integrated clock gate.

20. The testing apparatus of claim 19 wherein the test signal unit is configured to limit the toggle rate to remain within a design activity factor of the integrated circuit device.

* * * * *